United States Patent [19]
Son

[11] Patent Number: 5,750,430
[45] Date of Patent: May 12, 1998

[54] METHOD FOR MAKING METAL OXIDE SEMICONDUCTOR FIELD EFFECT TRANSISTOR (MOSFET)

[75] Inventor: Jeong-Hwan Son, Daejon, Rep. of Korea

[73] Assignee: LG Semicon Co., Ltd., Choongcheongbuk-Do, Rep. of Korea

[21] Appl. No.: 701,898

[22] Filed: Aug. 23, 1996

[30] Foreign Application Priority Data

Dec. 28, 1995 [KR] Rep. of Korea ............... 62053/1995

[51] Int. Cl.[6] ................................................. H01L 21/336
[52] U.S. Cl. ........................ 438/303; 438/291; 438/307
[58] Field of Search .............................. 437/44, 40 GS, 437/41 GS, 40 RG, 41 RG, 203, 28, 913, 40 SW, 41 SW; 148/DIG. 53; 438/303, 305, 306, 307

[56] References Cited

U.S. PATENT DOCUMENTS

| | | |
|---|---|---|
| 4,359,816 | 11/1982 | Abbas et al. .................. 437/40 GS |
| 4,994,404 | 2/1991 | Sheng et al. ........................ 437/44 |
| 5,120,668 | 6/1992 | Hsu et al. ........................... 437/44 |
| 5,175,119 | 12/1992 | Matsutani ........................... 437/44 |
| 5,429,956 | 7/1995 | Shell et al. ..................... 437/41 RG |
| 5,489,543 | 2/1996 | Hong ............................ 437/40 RG |
| 5,538,913 | 7/1996 | Hong ................................. 437/44 |

OTHER PUBLICATIONS

Huang, T., et al., "A Novel Submicron LDD Transistor With Inverse-T Gate Structure," IEDM 86, pp. 742–745.

Primary Examiner—Michael Trinh
Attorney, Agent, or Firm—Fleshner & Kim

[57] ABSTRACT

A metal oxide semiconductor field effect transistor includes source and drain regions formed between a gate. The gate comprises a first conductive layer and a second conductive layer formed on the first conductive layer, and the second conductive layer has curved sidewalls with an insulating layer formed adjacent to the sidewalls. The method of making such a transistor improves the fabrication process, since the deposition thickness is controlled rather than the amount of etching. The transistor has a shortened channel width with reduced overlap capacitance, and the LDD doping compensation phenomenon is removed.

12 Claims, 3 Drawing Sheets

METHOD FOR MAKING METAL OXIDE SEMICONDUCTOR FIELD EFFECT TRANSISTOR (MOSFET)

TECHNICAL FIELD

The present invention relates to a field effect transistor, and more particularly, to an improved metal oxide semiconductor field effect transistor (hereinafter, called "MOSFET").

BACKGROUND ART

FIGS. 1A through 1F are views showing a fabrication method for a MOSFET having a conventional reverse-T type gate. As shown in FIG. 1A, a gate insulation film 2 and a conductive film 3, such as a multi-crystalline silicon film, are consecutively deposited on a p-type silicon substrate 1, and an oxidation film 4 is deposited thereon. By a lithographic etching, a photo resist film (not shown) formed on the oxidation film 4 is etched into a photo resist film pattern 5 which serves as a mask for etching the oxidation film 4.

Then, as shown in FIG. 1B, the photo resist film pattern 5 is removed, and the conductive film 3 is etched down to a predetermined depth thereof by using the oxidation film 4 as a mask. By using the remaining oxidation film 4 as a mask, the conductive film 3 is etched so that the conductive film portion beneath the oxidation film 4 can be relatively thicker than the other conductive film portion left behind after the etching.

By using the patterned oxidation film 4 as a mask, low density n-type impurities, such as phosphorus, are ion-implanted into the conductive film 3, as shown in FIG. 1C. As a result, regions 6 of a lightly doped drain (hereinafter, called "LDD") are formed in the p-type substrate 1 by means of a self-alignment. As shown in FIG. 1D, the patterned oxidation film 4 is removed, and an oxidation film is deposited on the conductive film 3. By etching-back the oxidation film, side wall spacers 7 are formed which cover the laterally extended portions of the conductive film 3.

By using the side wall spacers 7 as a mask, as shown in FIG. 1E, the conductive film 3 is etched to expose a predetermined portion of the gate insulation film 2. As shown in FIG. 1F, the side wall spacers 7 and the conductive film 3 therebeneath are used as a mask, and high density n-type impurities are ion-implanted through the externally exposed portion of the gate insulation film 2 to form an n+ source-drain regions 8 in the n– LDD regions 6, whereby fabrication of the MOSFET having the reverse-T type gate electrode is completed.

When a MOSFET is manufactured in accordance with the previously described fabrication steps, there are several disadvantages. The control of the etching amount remains difficult when etching the conductive film 3 down to a predetermined depth thereof using the oxidation film 4 as a mask. Since the n– LDD region doping density is lower than the channel region density when line width becomes sub-micron, the channel region may influence the n– LDD region.

In addition, the above-described conventional MOSFET fabrication process is difficult to apply a short channel with demanding design rule, because the channel length is confined by the available lithographic technology. A large overlap region between a gate electrode film and a drain region results in a large capacitance between the gate electrode film and the drain region.

DISCLOSURE OF THE INVENTION

The present invention is achieved at least in part by a semiconductor device comprising: a substrate; a channel region formed in the substrate; a gate insulation layer formed on the channel region; a gate formed on the gate insulation layer; and source and drain regions formed on opposite sides of the gate, wherein the gate includes a first conductive layer and a second conductive layer formed on the first conductive layer, and the second conductive layer having curved sidewalls with an insulating layer formed adjacent to the sidewalls.

The present invention is also achieved in part by a method of making a semiconductor device, comprising the steps of: forming a first insulative film on a substrate; removing a predetermined portion of the first insulative film to expose an area of the substrate; forming a channel region in the exposed area of the substrate; forming a gate within the predetermined portion of the first insulative film which has been removed; removing the first insulative film; and forming source and drain regions adjacent to the gate.

The MOSFET fabrication method in accordance with the present invention includes forming a disposable film on a substrate but exposing a predetermined surface portion of the substrate therethrough, forming a gate insulation film on the externally exposed surface of the substrate, forming a first conductive film on the disposable film and the gate insulation film, forming side wall spacers on the side walls of the first conductive film and on each side surface portion of the first conductive film beneath which the gate insulation film is formed, forming a second conductive film on the first conductive film so as to have the space between the side wall spacers entirely filled and, etching-back the second conductive film, removing the side wall spacers and forming a low density ion-implanted region in the substrate by ion-implanting impurities, forming an insulation film on the first and second conductive films having the same height as the disposable film, removing the disposable film, and forming source-drain regions in the substrate by ion-implanting impurities through the substrate surface from which the disposable film was removed.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1A:
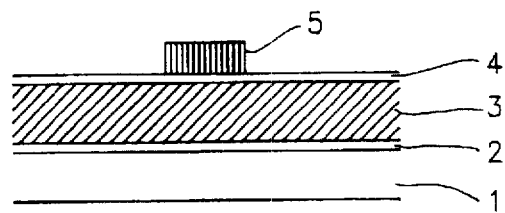
FIGS. 1A through 1F are views of a conventional MOSFET fabrication method.
Figure 1B:
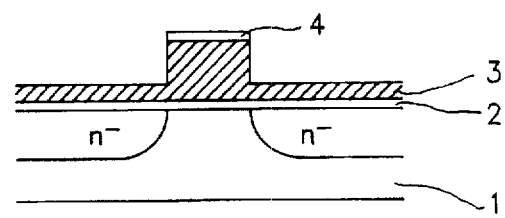
Figure 1C:
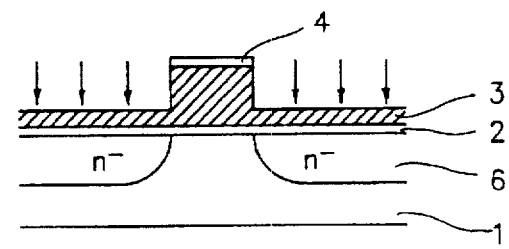
Figure 1D:
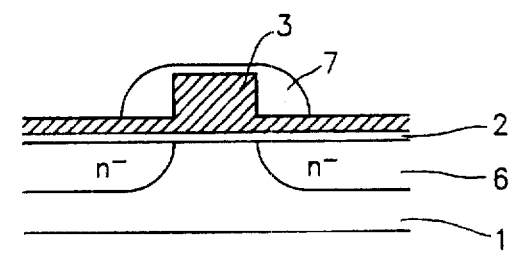
Figure 1E:
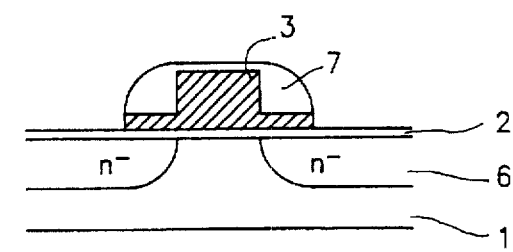
Figure 1F:
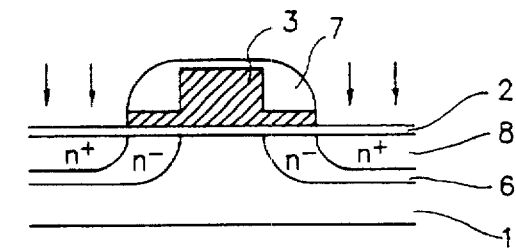
Figure 2A:
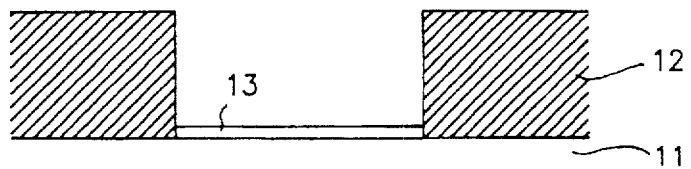
FIGS. 2A through 2F are views of a MOSFET fabrication method in accordance with an embodiment of the present invention.

With reference to FIGS. 2A through 2F, a metal oxide semiconductor field effect transistor (MOSFET) fabrication method in accordance with a first embodiment of the present invention is detailed as follows. As shown in FIG. 2A, a nitride film, serving as a disposable film 12, is deposited on a p-type substrate 11 (or an n-type substrate having a p-well) and is etched to expose a predetermined surface portion of the substrate 11 therethrough. The disposable film is formed by a CVD process and has a thickness of about 2000 to 4000 angstroms.

Figure 2B:
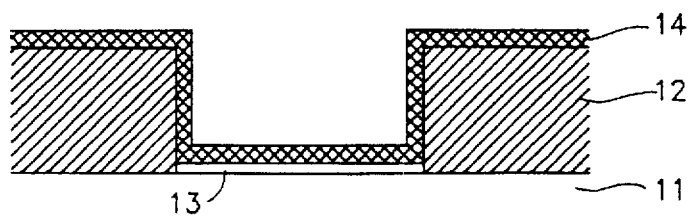

A gate insulation film 13, such as an oxide film formed by CVD or thermal oxidation, is formed on the exposed substrate surface and has a thickness of about 40 to 200 angstroms. Next, a first conductive film 14, such as a doped polysilicon or a doped amorphous film of about 500 to 1000 angstrom thickness, is deposited on the disposable film 12 and the gate insulation film 13, as shown in FIG. 2B.

Figure 2C:
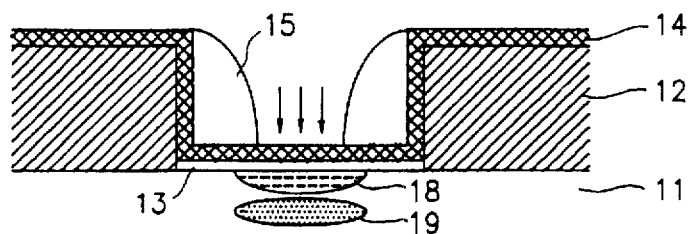

Then, as shown in FIG. 2C, an oxide film is deposited on the first conductive film 14 and is anisotropically etched therefrom so as to leave side wall spacers 15 of 500 to 1000 angstrom thickness formed on the walls and side parts of the bottom surface of the recess formed within the first conductive film 14. Using the side wall spacers 15 as a mask, an ion-implantation of p-type impurity ions is performed through the exposed first conductive film 14 using a punch-through stop ion-implantation and a channel implantation. For boron impurity ions, the energy level is about 30 to 60 KeV at a dose of about $1\times10^{12}$ to $5\times10^{13}/cm^2$. For BF impurity ions, the enery level is about 80 to 150 KeV at a dose of about $1\times10^{12}$ to $5\times10^{13}/cm^2$. Hence, a channel region 18 and a punch-through stop ion-implanted region 19 are formed in the substrate 11.

Figure 2D:
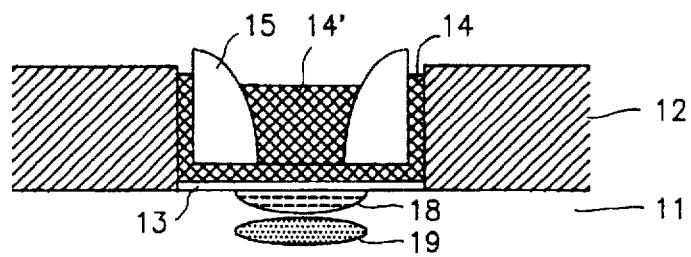

Thereafter, as shown in FIG. 2D, a second conductive film 14', such as a doped polysilicon and a doped amorphous silicon of about 1000 to 2000 angstrom thickness, is deposited on the side wall spacers 15 and on the first conductive film 14. The first and second conductive films 14, 14' are etched-back to form a gate electrode film composed of the first and second conductive films 14, 14'. During the process, the disposable film 12 serves as an EPD (end point detection) for detecting an etching-end point.

Figure 2E:
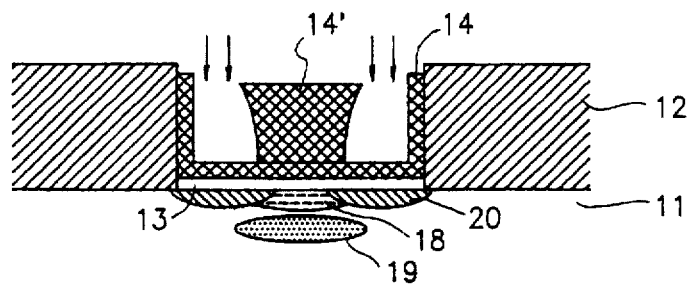

Subsequently, as shown in FIG. 2E, the side wall spacers 15 are removed by employing a selective wet etching or a dry etching. Low density n-type impurities are ion-implanted through the first conductive film surface portion from which the side wall spacers 15 are removed to form an n– LDD region 20 beneath the gate insulation film 13 on each side of the channel region 18. The energy level is about 40 to 80 KeV for phosphorus ions, and the energy level is about 80 KeV to 120 KeV for arsenic (As) ions. The dosage for both ions is about $10^{13}$ to $10^{14}/cm^2$.

Figure 2F:
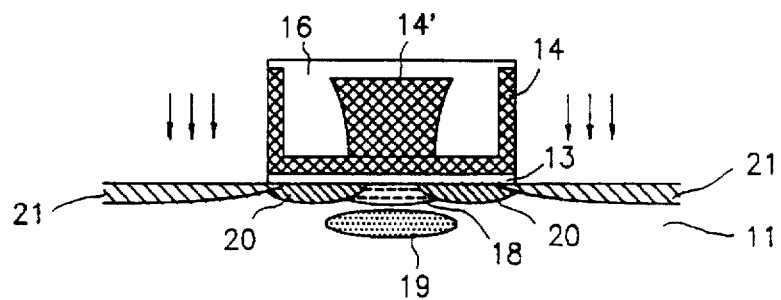

Finally, as shown in FIG. 2F, an oxide film for acting as the insulation film 16 of about 3000 to 6000 angstrom thickness is deposited on the first and second conductive films 14, 14' and the disposable film 12 to cover the first and second conductive films 14, 14'. The insulation film 16 is etched back for the planarization thereof. At this point, the disposable film 12 which serves as an EPD facilitates the above-described process.

The disposable film 12 is removed by employing a selective dry etching, and high density n-type impurities are ion-implanted through the exposed substrate 11 from the surface of which disposable film 12 was removed. For As ions, the energy level is about 10 KeV to 60 KeV at a dosage of $1\times10^{15}$ to $5\times10^{15}/cm^2$. The fabrication process is completed by forming source-drain regions 21 in contact with the n– LDD regions 20. It will be appreciated that the composing materials of the disposable film 12 and the side wall spacers 15 can be different than those described.

FIGS. 3A through 3F depict a MOSFET fabrication method in accordance with another embodiment of the present invention. Since the fabrication process shown in FIGS. 3A through 3F proceeds similarly to the process of the first embodiment of the present invention, as shown in FIGS. 2A through 2F, only a brief description thereof will follow.

Figure 3A:
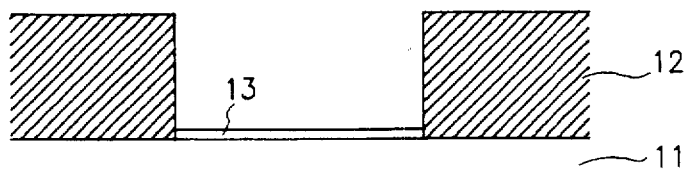
FIGS. 3A through 3F are views of a MOSFET fabrication method in accordance with another embodiment of the present invention.
Figure 3B:
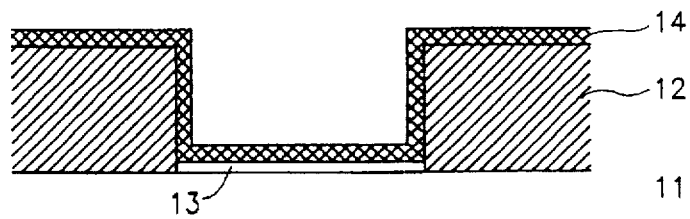

As shown in FIG. 3A, a nitride film serving as a disposable film 12 is formed on a p-type substrate 11 so as to expose a predetermined portion of the surface of the substrate 11 therethrough. A gate insulation film 13 is formed on the exposed substrate surface, and as shown in FIG. 3B, a first conductive film 14, such as a multi-crystalline silicon film, is deposited on the disposable film 12 and the gate insulation film 13.

Figure 3C:
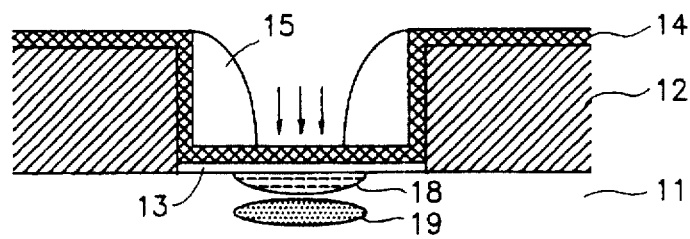
Figure 3D:
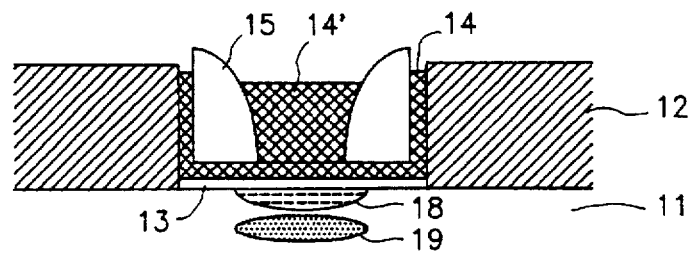

Then, as shown in FIG. 3C, an oxide film is deposited on the first conductive film 14 and selectively etched therefrom so as to leave side wall spacers 15 remaining on the walls and over the side portions of the bottom surface of the recess formed within the first conductive film 14. Using the side wall spacers 15 as a mask, an ion-implantation is performed through the exposed first conductive film 14 using a punch-through stop implantation and a channel implantation to form a punch-through stop ion-implanted region 19 and a channel region 18 inside the substrate 11. Thereafter, as shown in FIG. 3D, a second conductive film 14', such as a multi-crystalline silicon film, is deposited on the side wall spacers 15 and on the first conductive film 14.

Figure 3E:
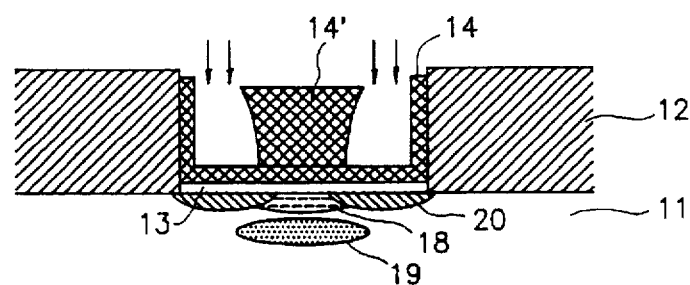

Thereafter, the first and second conductive films 14, 14' are etched back. During the etch-back process, the disposable film 12 acts as an EPD for detecting an etching end point. As shown in FIG. 3E, the side wall spacers 15 are removed by employing a selective wet etching or a dry etching. Low density n-type impurities are ion-implanted into the substrate 11 through the exposed first conductive film surface portions, from which the side wall spacers were removed, to form an n– LDD region 20 beneath the gate insulation film 13 and on each side of the channel region 18.

Figure 3F:
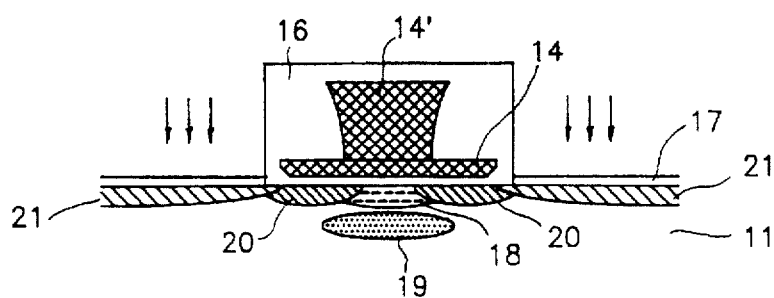

Finally, as shown in FIG. 3F, an oxide film, serving as an insulation film 16, is deposited on the first and second conductive films 14, 14' and the disposable film 12 to cover the conductive films 14, 14'. After etching back the insulation film 16 for the planarization thereof, the disposable film 12 is removed by a dry etching.

Thereafter, an oxidation process is performed to form a reverse-T type gate electrode composed of the first and second conductive films 14, 14', by growing a thermal oxide film 17 of a predetermined thickness on the substrate 11 from the surface of which the disposable film 12 was removed. At the same time, each side wall portion of the first conductive film 14, which is in contact with the disposable film 12, is oxidized by thermal oxidation. The fabrication process in accordance with the second embodiment of the present invention is completed by forming the source-drain regions 21 in contact with the n– LDD regions 20 by ion-implantation of high density n-type impurities through the thermal oxide film 17 into the substrate 11. As can be appreciated, the composing materials of the disposable film 12 and the side wall spacers 15 can be different from those described above.

The present invention facilitates the fabrication process because the first conductive film, which composes the gate electrode, can be controlled in its deposition thickness, instead of in the etching amount. The capacitance is reduced because the punch-through stop ion-implantation region has no connection to the source-drain region. The n– LDD region doping compensation effect is eliminated by minimizing the overlap portion between the channel region and the n– LDD regions, which are formed in different regions from each other. Thus a highly integrated MOSFET is realized, which is required for a short channel, by defining the channel length employing side wall spacers, instead of lithographic techniques, and reducing the overlap capacitance between the gate electrode film and the drain region. During the oxidizing process, each side wall portion of the first conductive film, which wall portion is connected to the disposable film, is oxidized concurrently.

The foregoing embodiment is merely exemplary and not to be construed as limiting the present invention.

The present scheme can be readily applied to other types of memory devices. The description of the present invention is intended to be illustrative, and not limiting the scope of the claims. Many alternatives, modifications and variations will be apparent to those skilled in the art.

I claim:

1. A fabrication method of making a field effect transistor, comprising the steps of:

forming a disposable film on a substrate having an opening to expose a portion of a surface of said substrate therethrough;

forming a gate insulation film on the exposed surface of the substrate;

forming a first conductive film on said disposable film and said gate insulation film;

forming side wall spacers on side walls of the first conductive film on each side surface portion of the first conductive film;

forming a second conductive film on the first conductive film so as to fill a space between the side wall spacers entirely, and then etching-back said second conductive film;

removing the side wall spacers and forming a low density ion-implantation region in the substrate by ion-implanting impurities through the exposed surface of the first conductive film from which the side wall spacers were removed;

forming an insulation film having approximately the same height as the disposable film on the first and second conductive films;

removing the disposable film; and forming source-drain regions in the substrate by ion-implanting impurities through the substrate surface from which the disposable film was removed.

2. The method of claim 1, wherein the side wall spacers are formed of one of an oxide film and a nitride film.

3. The method of claim 1, wherein the side wall spacers are removed using one of a wet etching and a dry etching.

4. The method of claim 1, wherein the disposable film is formed of one of a nitride film and an oxide film.

5. The method of claim 1, further comprising, after removing said disposable film from the substrate, forming a thermal oxide film on the substrate surface from which said disposable film was removed, and at the same time oxidizing each side wall of the first conductive film connected to said disposable film.

6. The method of claim 1, further comprising, after forming the side wall spacers on each side wall of the first conductive film, forming a punch-through stop ion-implanted region and a channel region in the substrate by ion-implanting impurities through the exposed first conductive film using the side wall spacers as a mask.

7. The method of claim 1, wherein said insulation film is etched-back after depositing the insulation film on the disposable film and the first and second conductive films.

8. A method of making a semiconductor device, comprising the steps of:

forming a first insulative film on a substrate;

removing a portion of said first insulative film to expose an area of said substrate;

forming a gate insulation layer over the exposed area of said substrate in the portion;

forming a first conductive film over said first insulative film including sidewalls and said gate insulation layer;

forming side wall spacers adjacent the first conductive film over the sidewalls in the portion;

forming a channel region in said substrate;

forming a second conductive film to fill a space between the side wall spacers;

removing said side wall spacers to expose the first conductive layer; and implanting impurities to form lightly doped drain regions through the exposed first conductive layer.

9. The method of claim 8, further comprising the steps of:

forming a second insulative film on said first conductive film from which the side wall spacers were removed and the second conductive film in the portion;

removing said first insulative film adjacent the portion; and forming source and drain regions in the substrate adjacent to the gate insulation layer.

10. The method of claim 8, wherein the step of forming the channel region comprises step of ion-implantation of impurities using said side wall spacers as a mask, whereby a punch-through stop region is also formed beneath the channel region in said substrate.

11. The method of claim 8, wherein the step of implanting impurities to form lightly doped drain regions uses ion implantation with said second conductive film as a mask.

12. The method of claim 9, wherein said step of forming said source and drain regions comprises the steps of:

forming a thermal oxide film on the surface of the substrate where said first insulative film was removed; and ion implantation of impurities through the thermal oxide film using said gate as a mask.

* * * * *